(12) United States Patent
Wang

(10) Patent No.: US 9,947,634 B1
(45) Date of Patent: Apr. 17, 2018

(54) ROBUST MEZZANINE BGA CONNECTOR

(71) Applicant: NORTHROP GRUMMAN SYSTEMS CORPORATION, Falls Church, VA (US)

(72) Inventor: Ge Wang, Los Alamitos, CA (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 0 days.

(21) Appl. No.: 15/621,726

(22) Filed: Jun. 13, 2017

(51) Int. Cl.
*H01R 13/24* (2006.01)
*H01L 23/00* (2006.01)

(52) U.S. Cl.
CPC ............. *H01L 24/14* (2013.01); *H01R 13/24* (2013.01)

(58) Field of Classification Search
CPC ... H01L 24/14; H01R 13/2421; H01R 13/465; H01R 13/631; H01R 9/28; H01R 9/2408
USPC ............................... 439/50, 66, 71
See application file for complete search history.

(56) References Cited

U.S. PATENT DOCUMENTS

| | | | | |
|---|---|---|---|---|
| 5,477,933 A | * | 12/1995 | Nguyen | ............ H01L 23/49816 174/260 |
| 5,572,405 A | * | 11/1996 | Wilson | ................... H01L 23/36 165/80.3 |
| 5,593,322 A | | 1/1997 | Swamy et al. | |
| 5,997,317 A | | 12/1999 | Pei et al. | |
| 6,049,976 A | * | 4/2000 | Khandros | ............ B23K 1/0016 228/180.5 |
| 6,050,832 A | * | 4/2000 | Lee | ................... H01L 23/49833 257/E23.063 |
| 6,081,038 A | * | 6/2000 | Murayama | ............ H01L 21/563 257/783 |
| 6,199,273 B1 | * | 3/2001 | Kubo | .................. H01L 21/4853 174/250 |
| 6,202,297 B1 | * | 3/2001 | Faraci | ..................... H05K 3/326 228/180.22 |
| 6,265,673 B1 | * | 7/2001 | Higashida | ............ H01L 21/486 174/260 |
| 6,286,205 B1 | * | 9/2001 | Faraci | ..................... H05K 3/326 228/180.22 |
| 6,286,208 B1 | * | 9/2001 | Shih | ................... H01R 13/2414 29/848 |
| 6,319,829 B1 | * | 11/2001 | Pasco | ................ H01L 23/49827 257/700 |
| 6,337,445 B1 | * | 1/2002 | Abbott | .............. H01L 23/49816 174/257 |

(Continued)

*Primary Examiner* — Abdullah Riyami
*Assistant Examiner* — Vladimir Imas
(74) *Attorney, Agent, or Firm* — John A. Miller; Shumaker, Loop & Kendrick, LLP

(57) ABSTRACT

A ball grid array (BGA) connector including an outer housing, an insert mounted within the outer housing having a first side and a second side, and a plurality of electrical contacts provided within the insert. The BGA connector also includes a plurality of connector balls electrically coupled to the electrical contacts at the first side of the insert, where some of the connector balls have a low Young's modulus and some of the connector balls have a high Young's modulus such that the high Young's modulus connector balls carry more of a separation load than the low Young's modulus connector balls. In one embodiment, the high Young's modulus connector balls are located around an outer periphery of the BGA. Also, the high modulus connector balls are soldered to larger solder pads than the low modulus connector balls.

20 Claims, 1 Drawing Sheet

(56) References Cited

U.S. PATENT DOCUMENTS

| | | | | |
|---|---|---|---|---|
| 6,354,844 B1* | 3/2002 | Coico | H05K 3/325 | 439/260 |
| 6,759,741 B2* | 7/2004 | Kline | H01L 22/20 | 257/727 |
| 6,830,463 B2* | 12/2004 | Keller | H01L 23/49827 | 257/E23.067 |
| 6,914,326 B2* | 7/2005 | Rumsey | H01L 23/3114 | 174/250 |
| 7,004,760 B2* | 2/2006 | Kawazoe | H01R 9/096 | 439/66 |
| 7,033,911 B2* | 4/2006 | Manepalli | H01L 23/5387 | 257/E23.177 |
| 7,170,159 B1* | 1/2007 | Lu | H01L 23/14 | 257/686 |
| 7,196,907 B2* | 3/2007 | Zheng | H01R 13/2435 | 361/760 |
| 7,215,016 B2* | 5/2007 | Wang | H01L 25/0652 | 257/686 |
| 7,361,972 B2* | 4/2008 | Chen | H01L 23/42 | 257/622 |
| 7,378,733 B1* | 5/2008 | Hoang | H01L 23/50 | 257/724 |
| 7,495,330 B2* | 2/2009 | Ichikawa | H01L 23/49827 | 257/698 |
| 7,675,186 B2* | 3/2010 | Chen | H01L 23/13 | 257/790 |
| 7,863,101 B2* | 1/2011 | Suzuki | H01L 25/0652 | 257/685 |
| 8,034,661 B2* | 10/2011 | Lin | H01L 21/568 | 257/E21.503 |
| 8,083,528 B2* | 12/2011 | Sakairi | H01R 13/2435 | 439/66 |
| 8,299,607 B2* | 10/2012 | Ihara | H01L 23/055 | 257/706 |
| 8,435,834 B2* | 5/2013 | Pagaila | H01L 21/568 | 438/106 |
| 8,492,197 B2* | 7/2013 | Cho | H01L 21/4857 | 438/108 |
| 8,637,992 B2* | 1/2014 | Sakuma | H01L 21/563 | 257/737 |
| 8,759,963 B2* | 6/2014 | Nah | H01L 21/50 | 257/686 |
| 8,809,181 B2* | 8/2014 | Sidhu | B23K 35/22 | 257/E21.509 |
| 8,883,563 B1* | 11/2014 | Haba | H01L 23/3128 | 438/112 |
| 8,941,248 B2* | 1/2015 | Lin | H01L 21/563 | 257/778 |
| 9,263,378 B1* | 2/2016 | Nah | H01L 21/0334 | |
| 9,466,546 B2* | 10/2016 | Hatakeyama | H01L 21/561 | |
| 9,478,514 B2* | 10/2016 | Chang | H01L 21/6836 | |
| 9,502,360 B2* | 11/2016 | Lin | H01L 25/105 | |
| 9,646,917 B2* | 5/2017 | Katkar | H01L 23/481 | |
| 9,646,946 B2* | 5/2017 | Li | H01L 24/14 | |
| 9,679,811 B2* | 6/2017 | Pendse | H01L 21/76885 | |
| 9,761,477 B2* | 9/2017 | Chang | H01L 21/6836 | |
| 2001/0020545 A1* | 9/2001 | Eldridge | B23K 20/004 | 174/260 |
| 2001/0020546 A1* | 9/2001 | Eldridge | B23K 20/004 | 174/261 |
| 2003/0030134 A1* | 2/2003 | Tao | H01L 21/563 | 257/678 |
| 2006/0099788 A1* | 5/2006 | Davison | H01L 24/11 | 438/597 |
| 2007/0278671 A1* | 12/2007 | Fan | H01L 23/13 | 257/734 |
| 2014/0091461 A1* | 4/2014 | Shen | H01L 23/24 | 257/738 |
| 2015/0091167 A1* | 4/2015 | Geissler | B81C 1/00261 | 257/738 |
| 2015/0348873 A1* | 12/2015 | Katkar | H01L 23/481 | 257/774 |
| 2016/0211189 A1* | 7/2016 | Niessner | H01L 23/145 | |

* cited by examiner

ROBUST MEZZANINE BGA CONNECTOR

BACKGROUND

Field

This invention relates generally to a multi-pin connector for an electronic device and, more particularly, to a mezzanine ball grid array (BGA) connector that provides an electrical connection between a mezzanine circuit card and a printed wiring board (PWB) assembly, where the BGA connector includes one or more high Young's modulus balls.

Discussion

Solid-state electronic devices, such as flip-chip devices, printed circuit boards (PCBs), high-power application specific integrated circuits (ASICs), etc. are often employed in electrical systems. These electrical systems may also include replaceable electronic circuits, sometimes referred to as plug-in circuit cards, that are removably coupled to the system to provide system upgrades, replace failing modules, etc. One specific example of such a plug-in circuit card is known as a mezzanine card that is typically smaller than standard plug-in cards, and is often designed for rugged industrial use.

These plug-in cards typically include some type of connector that allows the card to be coupled and decoupled from the electrical system, sometimes referred as a mate/demate operation. The connectors may employ a fine-pitch ball grid array (BGA) or column grid array (CGA) possibly having several hundred or even a few thousand conductive solder balls or electrically conductive columns that provide the electrical connection between the circuit and the leads to the circuit, and also could provide a mounting structure for the card. The solder balls of a BGA are soldered to connector pins that extend through the connector to be coupled to external leads. Likewise, the solder balls are soldered to suitable pins that extend into the circuit, possibly through multiple layers.

One type of plug-in card is known in the art as a line replacement unit (LRU), which is a modular component typically associated with an aircraft, ship or spacecraft that is designed to be replaced quickly. To reduce the weight and size of the LRU, but with increased capacity, the connections between a multi-pin mezzanine BGA connector and the LRU are made through the area array solder joints. This solder attachment provides a high density inter-connection without using through-hole solder connections for ease of connector installation consistent with ubiquitous, economical surface mount technology and increased printed circuit board (PCB) real estate for circuit routing.

The mate/demate operation between the connecting pins creates a spring action on the pin. A BGA solder joint between each solder ball and connecting pin is very small in size, typically approximately 0.060 inches in diameter. On the other hand, the mate/demate force exerted onto the connector is relatively high given the large number of connector pins and their friction force during making or breaking the spring-loaded contacts. Often, the demate force can be as high as 30 pounds per connector. As a result, the demate force on a connector may cause the BGA solder pad beneath the solder ball to detach from the printed wiring board (PWB) that may be made of a glass fiber cloth and a polymeric resin. Further, the copper barrel of the "via-in-pad" design may crack after several connector mate/demate operations. Damaged solder pad and copper barrels in the PWB can lead to operational error and system failure. Therefore, what is needed, is a BGA connector construction that is more robust against the mate/demate operations.

One proposed approach for correcting the problem of overloading BGA solder joints as a result of a connector demating force is by adding an adhesive between the connector body and the PWB. This solution is inherently operator dependent since the application of the adhesive is a manual operation, where the location, amount and coverage of the adhesive will vary between connectors. To compensate for the large variability in operator experience and adhesive lot, over-design of the adhesive joint may be required to account for worst case adhesive joint geometry and adhesive cure schedule. Further, the coefficient of thermal expansion (CTE) mismatch between the adhesive and solder joints creates a thermal stress within the solder joint during temperature cycles. Solder alloys are vulnerable to low cycle fatigue failure in joint construction with unfavorable thermal expansion and contraction.

DETAILED DESCRIPTION OF THE EMBODIMENTS

Figures 1, 2, 3:
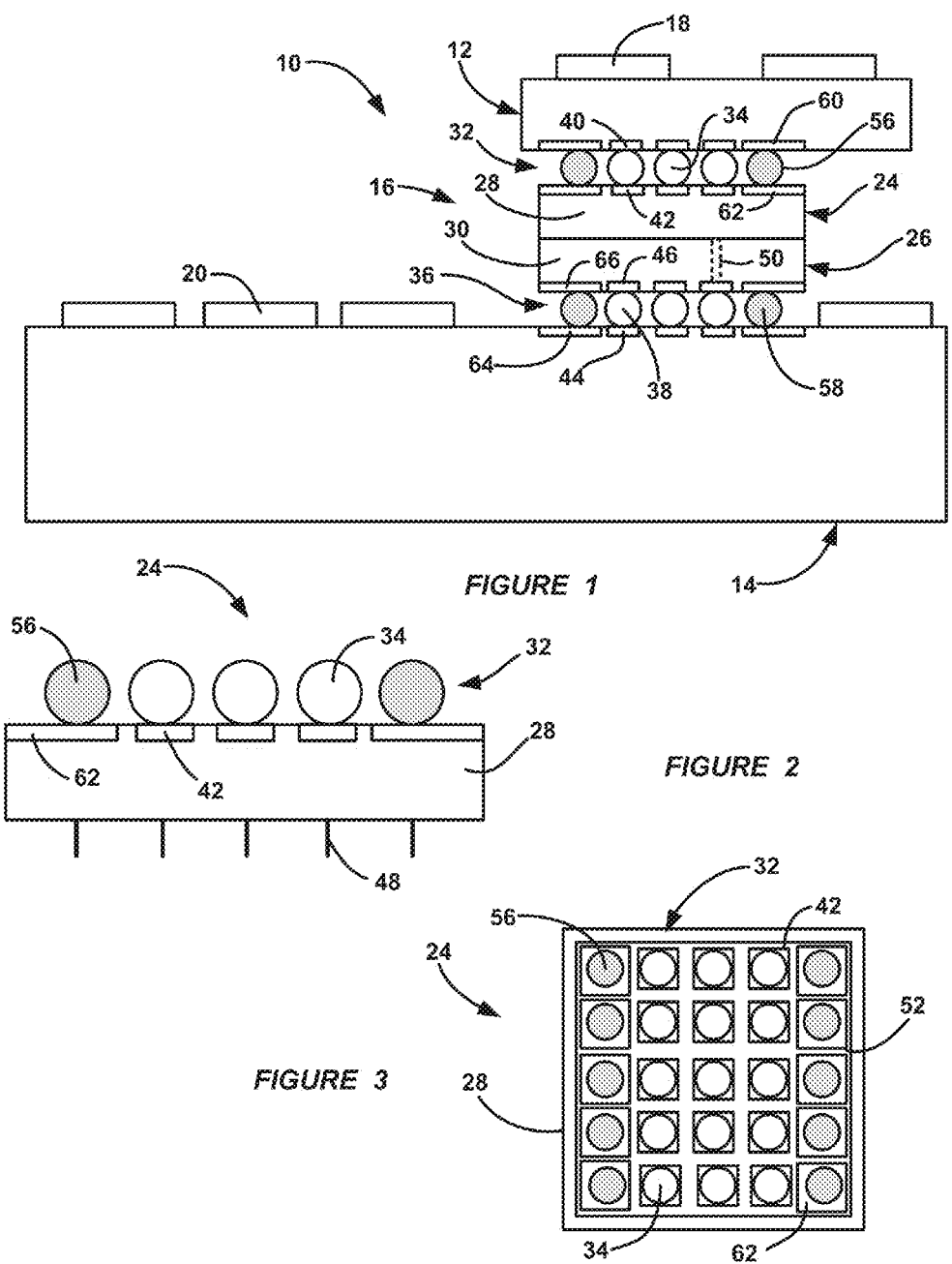
FIG. 1 is a profile view of a circuit assembly including coupled mezzanine BGA connectors each having one or more high Young's modulus balls.
FIG. 2 is a profile view of one of the BGA connectors separated from the circuit assembly.
FIG. 3 is a back view of the BGA connector shown in FIG. 2.

The following discussion of the embodiments of the invention directed to a mezzanine BGA connector including one or more high Young's modulus connector balls is merely exemplary in nature, and is in no way intended to limit the invention or its applications or uses. For example, as mentioned, the connector discussed herein is referred to as a mezzanine BGA connector. However, employing high Young's modulus connector balls to increase solder joint integrity may be applicable to other types of connectors.

One technical challenge to the problem discussed above concerning BGA connector solder joint failure during a demate operation is to constrain the solder joint displacement, and thus move the demate load away from all of the electrically functional solder pads without adding adhesives to the BGA connector. The present invention proposes a solution that includes providing a "bridging construct" having a CTE that closely matches the CTE of the connector balls, but having a high Young's modulus so that the elastic displacement of all of the BGA solder joints are constrained by the bridging construct. As a result, destructive forces on the connector balls and solder pads during the demate operation is greatly reduced without employing messy and potentially detrimental adhesive staking on the connector. It is noted that the balls in the BGA connector are referred to herein as connector balls instead of connector balls because those connector balls that have a high Young's modulus typically do not melt during the assembly process.

The above-described solution includes employing two different metal alloys for construction of the BGA connector balls in a BGA connector. Most of the connector balls in the BGA are made of a traditional low Young's modulus collapsible alloy, such as a SN63PB3 solder alloy, which is a lead alloy eutectic solder, as defined in IPC J-STD-006. Other BGA connector balls in the BGA, for example, those on the outer periphery of the BGA connector, are made of a metal alloy having a high Young's modulus and good CTE match with the SN63PB3 solder alloy. During application, the SN63PB3 solder alloy balls make connections to solder pads on the PWB. The outer periphery high-modulus connector balls are also soldered to solder pads, except that the solder pads on the outer periphery are slightly larger in size than the other solder pads so that the stress on the outer periphery solder pads is reduced. Since the solder pads are on the periphery of the connector, a slightly larger pad area is not a concern for PWB routing.

FIG. 1 is a profile view of a circuit assembly 10 providing one non-limiting illustration of the connector of the invention as discussed above. The circuit assembly 10 includes a mezzanine circuit card 12 electrically coupled to a printed wiring board (PWB) assembly 14 by a mezzanine BGA connector assembly 16 so as to electrically couple electrical circuits or modules 18 on the card 12 to electrical circuits or modules 20 on the PWB assembly 14. The connector assembly 16 includes a male pin mezzanine BGA connector 24 having an outer housing 28 and a female socket mezzanine BGA connector 26 having an outer housing 30. FIG. 2 is a profile view and FIG. 3 is a back view of the BGA connector 24 separated from the circuit assembly 10. The BGA connector 24 includes a BGA 32 having a number of connector balls 34 that are soldered to solder pads 40 in the card 12 and solder pads 42 in the housing 28. Likewise, the BGA connector 26 includes a BGA 36 having a number of connector balls 38 that are soldered to solder pads 44 in the PWB assembly 14 and solder pads 46 in the housing 30. A separate pin 48 is electrically coupled to each solder pad 42 and extends out of the housing 28. The BGA connector 24 includes a plastic connector insert or body 52 made of a suitable polymeric material, for example, a liquid crystal polymer. The connector body 52 includes a plurality of cavities (not shown) that accept the pins 48. Likewise, the BGA connector 26 includes a similar insert or body having suitable cavities in which spring-loaded sockets 50 are mounted. The pins 48 extend into the housing 30 of the BGA connector 26 and make electrical contact with the sockets 50 therein. Thus, electrical connection between the various circuits or modules 18 can be made to the various circuits or modules 20 through the connector assembly 16.

As discussed above, the connector assembly 16 allows the card 12 to be disconnected from the PWB assembly 14 so that it can be replaced with other cards for failure purposes, upgrade purposes, etc. When the card 12 is demated from the PWB assembly 14, a user will typically grasp the card 12 and pry upward so that the pins 48 in the BGA connector 24 disengage from the sockets 50 in the BGA connector 26. This prying operation creates stresses on the solder joints between the solder pads 40 and 42 and the connector balls 34, and on the solder joints between the solder pads 44 and 46 and the connector balls 38.

As discussed above, in order to reduce the chance of failure of the BGA connectors 24 and 26 at these solder joints, and thus increase the number of mate/demate operations, some of the connector balls 34 and 38 are made as high Young's modulus connector balls that are able to handle higher stress than the traditional low Young's modulus connector balls. In this non-limiting example, the BGA 32 includes high Young's modulus connector balls 56 shown by darker shading that are provided in two opposing rows at the outer periphery of the array 32 where the higher demate stress would occur. Likewise, the BGA 36 includes high Young's modulus connector balls 58, also provided in two opposing rows at the outer periphery of the BGA 36 where the higher demate stress would occur. Although two rows of the connector balls 56 and 58 provided at the outer periphery of the connectors 24 and 26 are high Young's modulus connector balls in this non-limiting example, in other designs a fewer number of the connector balls 34 and 38 can be made with a high Young's modulus material, such as every other one of the connector balls, or all of the connector balls at the outer periphery of the connector 24 or 26 can be high Young's modulus connector balls.

Further, as mentioned above, solder pads 60 in the card 12, solder pads 62 in the connector 24, solder pads 64 in the PWB assembly 14 and solder pads 66 in the connector 26 that are coupled to the high Young's modulus connector balls 56 or 58 have a larger size than the solder pads 40, 42, 44 and 46.

During the demating operation of the connectors 24 and 26, the demating load is carried by the BGA connector balls 56 and 58 on the outer periphery of the connectors 24 and 26 because they have a higher elasticity. In other words, by providing the high elasticity Young's modulus connector balls 56 and 58 at select locations in the BGAs 32 and 36, those connector balls 56 and 58 will accept most of the load of the mate and demate operations so that the other connector balls 34 and 38 in the BGAs 32 and 36 are protected from the mate/demate stress. Thus, those protected connector balls 32 and 36 can have less robust solder connections to the solder pads 40, 42, 44 and 46, and still allow for better use of the real estate on the card 12 and the PWB assembly 14. Further, the larger solder pads 60, 62, 64 and 66 at these locations effectively and substantially reduce the pad stress. As such, the BGA connectors 24 and 26 will sustain many times more mate/demate operations in comparison with the known BGA connectors. By putting the high Young's modulus connector balls 56 on the outer periphery of the connector 24, the balance of the load is better distributed across the connector 24.

In other embodiments, instead of replacing all or most of the connector balls on the outer periphery of the connector with high Young's modulus connector balls, only selected ones of the BGA connector balls are replaced with high Young's modulus connector balls, while still ensuring smaller elastic strain in the rest of the connector balls. For example, for a long, slender connector, only the outer rows at the far-apart ends of the connector may need to be replaced with the high modulus connector balls. In an extreme case, only the corner connector balls, which is typically four balls in a connector, may be replaced and all the other balls can be maintained as the SN63PB37 connector balls.

The high Young's modulus metal for the connector balls 56 and 58 is selected so that the modulus value is sufficiently high and its CTE closely matches that of the SN63PB37 solder alloy. In one embodiment, the high modulus metal for the connector balls 56 and 58 is manganese or manganese alloys. The SN63PB37 solder alloy has a modulus of 6 Msi and a CTE of 23 ppm/c, and manganese has a modulus of 23 Msi and a CTE of 22 ppm/c, thus providing a near perfect match between the CTE of the manganese material and the SN63PB37 material, and the modulus of manganese is almost four times that of SN63PB37 solder. As such, the high modulus connector balls 56 and 58 carry substantially more load than that of the SN63PB37 connector balls during a connector demating operation, which effectively reduces the load on the connector balls.

Still effective, but generally less sufficient, other metals may be used for the high-modulus connector balls, including copper and copper alloys, silver and silver alloys, and aluminum and aluminum alloys. For aluminum balls, a metal coating with good solder ability must be applied on the metal balls before they can be soldered to the connector and to the PWB solder pads.

In an alternate embodiment, all of the outer periphery pads 60, 62, 64 and 66 can be ground pads and be electrically connected together and effectively made a ground ring. The connected pads will substantially increase the pad area to reduce pad stress during connector demate. In addition, such a ground pad design makes a robust EMI shielding of the electrical signals carried by the connector.

The connectors, either with pin contacts or socket contacts, are reflowed solder to the PWBs. The BGA connection may later be under filled with a polymeric adhesive or encapsulation compound. An under filled BGA connection not only may have a better fatigue life performance of the solder joints, but may be resistant to electrical shorts caused by conductive debris that may be present within the assembly or from the environment.

The foregoing discussion discloses and describes merely exemplary embodiments of the present invention. One skilled in the art will readily recognize from such discussion and from the accompanying drawings and claims that various changes, modifications and variations can be made therein without departing from the spirit and scope of the invention as defined in the following claims.

What is claimed is:

1. A ball grid array (BGA) connector comprising:
an outer housing;
an insert mounted within the outer housing and including a first side and a second side;
a plurality of electrical contacts provided within the insert; and
a BGA including a plurality of connector balls soldered to the electrical contacts at the first side of the insert, wherein some of the connector balls have a first Young's modulus and some of the connector balls have a second Young's modulus where the first Young's modulus is greater than the second Young's modulus so that the first Young's modulus connector balls carry more of a separation load than the low Young's modulus connector balls.

2. The BGA connector according to claim 1 wherein the plurality of electrical contacts are pins and the BGA connector is a male pin connector.

3. The BGA connector according to claim 1 wherein the plurality of electrical contacts are spring loaded sockets and the BGA connector is a female socket connector.

4. The BGA connector according to claim 1 wherein the second Young's modulus connector balls are lead alloy or non-lead alloy connector balls and the first Young's modulus connector balls are magnesium or magnesium alloy connector balls.

5. The BGA connector according to claim 1 wherein the second Young's modulus connector balls are lead alloy or non-lead alloy connector balls and the first Young's modulus connector balls are copper or copper alloy, silver or silver alloy or aluminum alloy connector balls.

6. The BGA connector according to claim 1 wherein the first Young's modulus connector balls are only provided around the periphery of the insert.

7. The BGA connector according to claim 6 wherein only some of the outer periphery connector balls are the first Young's modulus connector balls.

8. The BGA connector according to claim 1 wherein the insert includes a plurality of connector pads where each solder pad is soldered to one of the connector balls and each of the plurality of contacts is electrically coupled to one of the solder pads, wherein the solder pads that are soldered to the first Young's modulus connector balls are larger than the solder pads soldered to the second Young's modulus connector balls.

9. The BGA connector according to claim 1 wherein the connector balls are soldered to an electrical circuit opposite to the housing.

10. The BGA connector according to claim 9 wherein the circuit assembly is a mezzanine circuit card or a printed wire board assembly.

11. The BGA connector according to claim 1 wherein the BGA connector is a mezzanine connector.

12. The BGA connector according to claim 1 wherein the outer periphery pads are a ground ring.

13. A ball grid array (BGA) connector comprising:
a plurality of electrical contacts provided within the insert;
a BGA including a plurality of connector balls soldered to the electrical contacts at the first side of the insert, wherein some of the connector balls have a first Young's modulus and some of the connector balls have a second Young's modulus where the first Young's modulus is greater than the second Young's modulus so that the first Young's modulus connector balls carry more of a separation load than the second Young's modulus connector balls; and
a plurality of solder pads where each solder pad is soldered to one of the connector balls and each of the plurality of contacts is electrically coupled to one of the solder pads, wherein the solder pads that are soldered to the first Young's modulus connector balls are larger than the solder pads soldered to the second Young's modulus connector balls.

14. The BGA connector according to claim 13 wherein the plurality of electrical contacts are pins and the BGA connector is a male pin connector.

15. The BGA connector according to claim 13 wherein the plurality of electrical contacts are spring loaded sockets and the BGA connector is a female socket connector.

16. The BGA connector according to claim 13 wherein the second Young's modulus connector balls are lead alloy or non-lead alloy connector balls and the first Young's modulus connector balls are magnesium or magnesium alloy connector balls.

17. The BGA connector according to claim 13 wherein the second Young's modulus connector balls are lead alloy or non-lead alloy connector balls and the first Young's modulus connector balls are copper or copper alloy, silver or silver alloy or aluminum alloy connector balls.

18. The BGA connector according to claim 13 wherein the first Young's modulus connector balls are only provided around the periphery of the insert.

19. The BGA connector according to claim 18 wherein only some of the outer periphery connector balls are the first Young's modulus connector balls.

20. A ball grid array (BGA) connector comprising:
an outer housing;
an insert mounted within the outer housing and including a first side and a second side;
a plurality of electrical contacts provided within the insert;
a BGA including a plurality of connector balls soldered to the electrical contacts at the first side of the insert, wherein some of the connector balls are magnesium or magnesium alloy connector balls and some of the connector balls are lead alloy or non-lead alloy connector balls so that the magnesium or magnesium alloy connector balls carry more of a separation load than the lead alloy or non-lead alloy connector balls, and wherein the magnesium or magnesium alloy connector balls are positioned around an outer periphery of the insert; and a plurality of solder pads where each solder pad is soldered to one of the connector balls and each of the plurality of contacts is electrically coupled to one of the solder pads, wherein the solder pads that are soldered to the magnesium or magnesium alloy connector balls are larger than the solder pads soldered to the lead alloy or non-lead alloy connector balls.

* * * * *